United States Patent [19]
Watanabe et al.

[11] Patent Number: 5,316,960
[45] Date of Patent: May 31, 1994

[54] C-MOS THIN FILM TRANSISTOR DEVICE MANUFACTURING METHOD

[75] Inventors: Hirofumi Watanabe, Miki; Noriyuki Terao, Sendai, both of Japan

[73] Assignees: Ricoh Company, Ltd., Tokyo; Ricoh Research Institute of General Electronics Co., Ltd., Natori, both of Japan

[21] Appl. No.: 78,409

[22] Filed: Jun. 17, 1993

Related U.S. Application Data

[60] Continuation-in-part of Ser. No. 824,552, Jan. 23, 1992, abandoned, which is a division of Ser. No. 550,154, Jul. 9, 1990, abandoned.

[30] Foreign Application Priority Data

Jul. 11, 1989 [JP] Japan ................... 1-178716

[51] Int. Cl.$^5$ .......................... H01L 21/265
[52] U.S. Cl. ...................... 437/40; 437/29; 437/57; 437/913; 148/DIG. 150; 148/DIG. 137
[58] Field of Search .......... 437/40, 29, 30, 56, 437/57, 58, 913; 148/DIG. 150, DIG. 137

[56] References Cited

U.S. PATENT DOCUMENTS

| | | |
|---|---|---|
| 4,106,045 | 8/1978 | Nishi . |
| 4,406,710 | 9/1983 | Davies et al. . |
| 4,420,344 | 12/1983 | Davies et al. . |
| 4,507,846 | 4/1985 | Ohno . |
| 4,523,368 | 6/1985 | Feist ........................ 437/41 |
| 4,717,683 | 1/1988 | Parrillo et al. ............ 437/34 |
| 4,753,896 | 6/1988 | Matloubian ............... 437/29 |
| 4,797,721 | 1/1989 | Hsu . |
| 4,933,296 | 6/1990 | Hasegawa ................. 437/40 |
| 4,945,067 | 7/1990 | Huang . |
| 4,946,799 | 8/1990 | Blake et al. .............. 437/41 |
| 4,969,023 | 11/1990 | Svedberg . |
| 5,030,582 | 7/1991 | Miyajima et al. ......... 437/34 |

FOREIGN PATENT DOCUMENTS

| | | |
|---|---|---|
| 2839933 | 4/1979 | Fed. Rep. of Germany . |
| 55-18052 | 5/1980 | Japan . |
| 55-61069 | 5/1980 | Japan . |
| 55-71068 | 5/1980 | Japan . |
| 56-91473 | 7/1981 | Japan . |
| 5578556 | 5/1984 | Japan ................ 437/57 |
| 5578557 | 5/1984 | Japan ................ 437/57 |
| 1100973 | 10/1987 | Japan . |
| 1171274 | 12/1987 | Japan . |
| 1120868 | 5/1989 | Japan . |
| 1310574 | 12/1989 | Japan . |

OTHER PUBLICATIONS

Ipri et al, "Low-threshold Low-Power CMOS/SOS for High Frequency Counter Applications", IEEE Journal of solid-state circuits, vol. SC-11, No. 2, Apr. 1976, pp. 329-336.

*Primary Examiner*—William Powell
*Assistant Examiner*—Michael Trinh
*Attorney, Agent, or Firm*—Cooper & Dunham

[57] ABSTRACT

A method for manufacturing a C-MOS thin film transistor device has the steps of implanting the n-type impurity only in the upper layer portion of the source-drain section of the n-channel transistor by controlling implantation energy of the n-type impurity; implanting the p-type impurity in the source-drain section and the gate electrode of the p-channel transistor, and the source-drain section and the gate electrode of the n-channel transistor by controlling implantation energy of the p-type impurity; and activating the implanted n-type and p-type impurities in the source-drain section of the n-channel transistor, and activating the implanted p-type impurity in the source-drain section and the gate electrode of the p-channel transistor and gate electrode of the n-channel transistor. The n-type and the p-type may be respectively changed to the p-type and the n-type in the above construction.

12 Claims, 2 Drawing Sheets

C-MOS THIN FILM TRANSISTOR DEVICE MANUFACTURING METHOD

CROSS-REFERENCE TO RELATED APPLICATION

The present application is a continuation-in-part of application Ser. No. 824,552 filed on Jan. 23, 1992, now abandoned which is a divisional of application Ser. No. 550,154 filed on Jul. 9, 1990, which is now abandoned, and is hereby incorporated by reference herein.

BACKGROUND OF THE INVENTION

1. Field of the Invention

The present invention relates to a C-MOS thin film transistor device and a method for manufacturing the C-MOS thin film transistor device.

2. Description of the Related Art

In a general monocrystal wafer process, a C-MOS transistor is approximately manufactured in accordance with the following processing sequence.

(1) formation of a p-well using a wafer n(100) about 2 Ω cm
(2) growths of a PAD oxide film and a $Si_3N_4$ film
(3) active photo-litho
(4) p-channel photo-litho
(5) implantation of a boron ion
(6) field oxidation
(7) growth of a gate oxide film
(8) Vth control photo-litho
(9) implantation of a boron ion
(10) growth of polysilicon
(11) diffusion of phosphorus (gate diffusion)
(12) patterning of polysilicon
(13) n+ diffusion photo-litho
(14) implantation of an arsenic ion: $1 \times 10^{16}$ cm$^{-2}$
(15) drive-in
(16) p+ diffusion photo-litho
(17) implantation of a boron ion: $1 \times 10^{15}$ cm$^{-2}$
(18) growth of a PSG film
(19) annealing
where the above processes (13) to (19) are set to form a source-drain region,
(20) contact photo-litho
(21) formation of aluminum wiring
(22) sintering
and
(23) formation of a passivation film As can be seen from the above processing sequence, a process for reducing the resistance of a gate electrode and a processing for forming the source-drain region are different from each other.

In an n-channel transistor, impurities of p- and n-types are implanted into the source-drain section so that it is necessary to set the concentration of the n-type impurity to be higher than that of the p-type impurity. Further, there is a problem that the resistance of the source-drain section is high.

SUMMARY OF THE INVENTION

It is therefore a first object of the present invention to provide a C-MOS thin film transistor device and a manufacturing method thereof in which the resistance of a gate electrode is reduced and a source-drain region is formed by the same process.

A second object of the present invention is to provide a C-MOS thin film transistor device and a manufacturing method thereof in which the resistance of the source-drain section of an n-channel transistor is sufficiently reduced.

The above objects of the present invention can be achieved by a C-MOS thin film transistor device, comprising: an n-channel transistor including: a first source-drain section disposed on a substrate, composed of a first semiconductor layer in the shape of a thin film, and formed such that an upper layer portion of the first semiconductor layer contains an n-type impurity at a high concentration and a lower layer portion of the first semiconductor layer contains a p-type impurity at a high concentration; and a first gate electrode disposed on the first semiconductor layer through an insulating film, composed of a second semiconductor layer, and formed such that the p-type impurity is contained at a high concentration in the second semiconductor layer; and a p-channel transistor including: a second source-drain section disposed on the substrate, composed of the other first semiconductor layer in the shape of a thin film, and formed such that the other first semiconductor layer contains the p-type impurity at a high concentration; and a second gate electrode disposed on the other first semiconductor layer through the insulating film, composed of the other second semiconductor layer, and formed such that the p-type impurity is contained at a high concentration in the other second semiconductor layer, and a method for manufacturing a C-MOS thin film transistor device, comprising the steps of: preparing an assembly including: a first semiconductor layer in the shape of a thin film, disposed on a substrate so as to form a first source-drain section of an n-channel transistor; the other first semiconductor layer in the shape of a thin film, disposed on the substrate so as to form a second source-drain section of a p-channel transistor; a second semiconductor layer formed on the first semiconductor layer through an insulating film so as to form a first gate electrode of the n-channel transistor; and the other second semiconductor layer formed on the other first semiconductor layer through an insulating film so as to form a second gate electrode of the p-channel transistor; implanting an n-type impurity into an upper layer portion of the first semiconductor layer while controlling implantation energy of the n-type impurity; implanting respectively a p-type impurity into a lower layer portion of the first semiconductor layer, the other first semiconductor layer, the second semiconductor layer and the other second semiconductor layer, while controlling implantation energy of the p-type impurity; and activating the implanted p-type and n-type impurities in an interior of the first semiconductor layer, and activating the implanted p-type impurity in the other first semiconductor layer, the second semiconductor layer and the other second semiconductor layer.

The above objects of the present invention can be also achieved by a C-MOS thin film transistor device, comprising: a p-channel transistor including: a first source-drain section disposed on a substrate, composed of a first semiconductor layer in the shape of a thin film, and formed such that an upper layer portion of the first semiconductor layer contains a p-type impurity at a high concentration and a lower layer portion of the first semiconductor layer contains an n-type impurity at a high concentration; and a first gate electrode disposed on the first semiconductor layer through an insulating film, composed of a second semiconductor layer, and formed such that the n-type impurity is contained at a high concentration in the second semiconductor layer; and an n-channel transistor including: a second source-drain section disposed on the substrate, composed of the other first semiconductor layer in the shape of a thin film, and formed such that a lower layer portion of the other first semiconductor layer contains the n-type impurity at a high concentration; and a second gate electrode disposed on the other first semiconductor layer through an insulating film, composed of the other second semiconductor layer, and formed such that the n-type impurity is contained at a high concentration in the other second semiconductor layer, and a method for manufacturing a C-MOS thin film transistor device, comprising the steps of: preparing an assembly including: a first semiconductor layer in the shape of a thin film, disposed on a substrate so as to form a first source-drain section of a p-channel transistor; the other first semiconductor layer in the shape of a thin film, disposed on the substrate so as to form a second source-drain section of an n-type channel transistor; a second semiconductor layer formed on the first semiconductor layer through an insulating film so as to form a first gate electrode of the p-channel transistor; and the other second semiconductor layer formed on the other first semiconductor layer through an insulating film so as to form a second gate electrode of the n-channel transistor; implanting a p-type impurity into an upper layer portion of the first semiconductor layer while controlling implantation energy of the p-type impurity; implanting respectively an n-type impurity into a lower layer portion of the first semiconductor layer, the other first semiconductor layer, the second semiconductor layer and the other second semiconductor layer, while controlling implantation energy of the n-type impurity; and activating the implanted n-type and p-type impurities in an interior of the first semiconductor layer, and activating the implanted n-type impurity in the other first semiconductor layer, the second semiconductor layer and the other second semiconductor layer.

The features of the manufacturing method of the C-MOS thin film transistor device in the present invention are that the range in implantation of an impurity is controlled by controlling the implantation energy thereof. Accordingly, the kinds of the impurities are freely selected, but implantation energies are different from each other in accordance with the kinds of the impurities.

Further objects and advantages of the present invention will be apparent from the following description of the preferred embodiments of the present invention as illustrated in the accompanying drawings.

DESCRIPTION OF THE PREFERRED EMBODIMENTS

Figure 1:
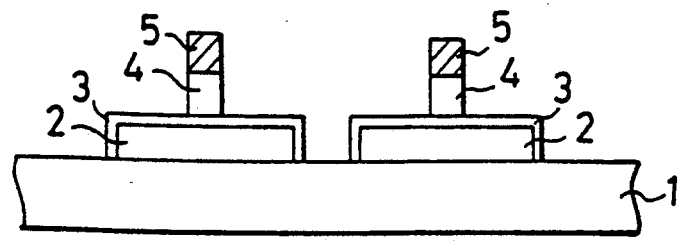
FIG. 1 to 4 are cross-sectional views showing processes for manufacturing a C-MOS thin film transistor device in an embodiment of the present invention.

The preferred embodiments of a C-MOS thin film transistor device and a manufacturing method thereof in the present invention will next be described in detail with reference to the accompanying drawings.

In FIGS. 1 to 4, an active layer 2 is composed of polysilicon and is formed on an insulating substrate 1 such as quartz, glass, etc. A gate oxide film 3 is formed by thermal oxidation on a surface of this active layer 2. A region having a high concentration with respect to an n-type impurity is formed in an upper layer portion of a source-drain section of an n-channel transistor and is shown by circular marks 0000. A region having a high concentration with respect to a p-type impurity is formed in respective lower layer portions of source-drain sections of n-channel and p-channel transistors and is also formed in respective gate electrodes of the n-channel and p-channel transistors. This region having a high concentration with respect to the p-type impurity is shown by marks xxxx.

In general, in the present invention, only an impurity of a first conductivity type is included in the source-drain region of a channel transistor of the first conductivity type and all regions of the gate electrodes composed of a second semiconductor layer. Impurities of both the first conductivity type and a second conductivity type opposite thereto are included in the source-drain region of a channel transistor of the second conductivity type.

A first semiconductor layer constituting the active layer 2 is constructed by a semiconductor such as monocrystal silicon, polycrystal silicon and amorphous silicon, each of which is formed on an insulator substrate. The thickness of the first semiconductor layer is ranged from 200 to 500 Å and is preferably ranged from 200 to 1000 Å. The first and second conductivity types are respectively constructed by the p-type and the n-type for example. In general, when no channel doping operation is performed with respect to a thin film transistor, the n-channel transistor is approximately operated in a depression mode so that no off current is sufficiently reduced. In contrast to this, when the thickness of the first semiconductor layer is ranged from 200 to 1000 Å and the first and second conductivity types are respectively the p-type and the n-type, the n-channel transistor is operated in a preferable enhancement mode. In the source-drain region of the channel transistor of the second conductivity type, the concentration of the impurity of the second conductivity type is at least a value twice the concentration of the impurity of the first conductivity type. Ions of the impurities of the first and second conductivity types are implanted such that an ion range of the impurity of the first conductivity type is smaller or greater by 100 to 1000 Å than that of the impurity of the second conductivity type, thereby reducing sheet resistivity of the source-drain section.

The concrete Embodiments 1 and 2 of the present invention will next be described.

EMBODIMENT 1

As shown in FIG. 1, polysilicon is deposited on the quartz substrate 1 using an LP-CVD method such that the thickness of this polysilicon layer is 1200 Å, thereby forming an active layer 2 of each of p-channel and n-channel transistors by a photo-litho etching technique. A thermal oxide film 3 having a thickness 800 Å is grown on a surface of the polysilicon active layer 2 by thermally oxidizing this polysilicon active layer at a temperature 1020° C. in an atmosphere of dry oxygen. Next, polysilicon is deposited by using the LP-CVD method such that the thickness of this polysilicon portion is 3000 Å, thereby forming a gate electrode 4 by the photo-litho etching technique. At this time, a resist pattern 5 formed by the photo-litho is left as it is as shown in FIG. 1.

Figure 2:
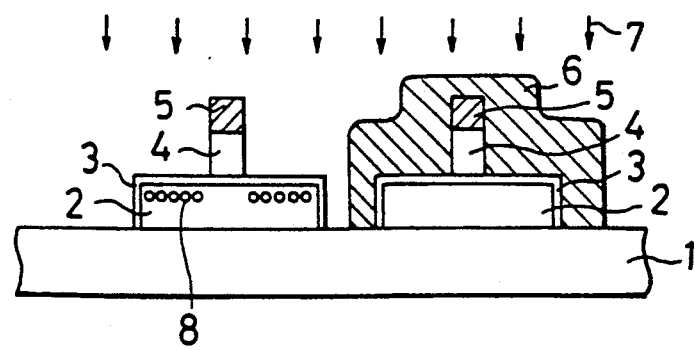
Figure 3:
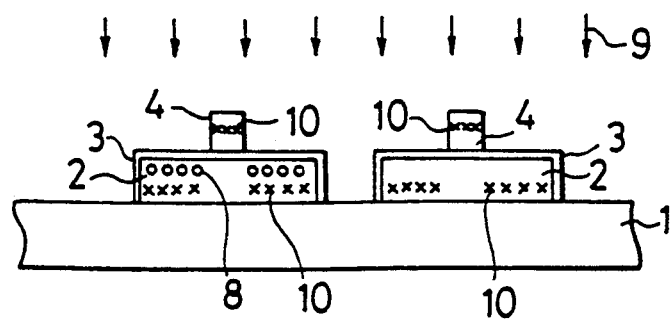
Figure 4:
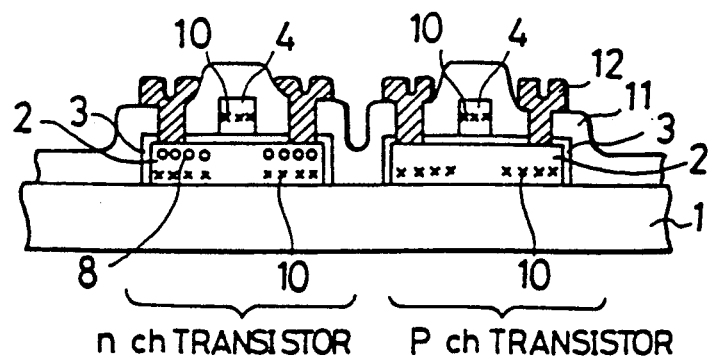

Next, as shown in FIG. 2, a resist 6 is formed on the p-channel transistor by the photo-litho technique and phosphorus (P+) 7 is implanted into the n-channel transistor, etc. by using an ion implantation method under a condition of implantation energy 80 KeV and dosing amount $4 \times 10^{15}$ atoms/cm$^2$. In this process, a source-drain region of the n-channel transistor is formed. Subsequently, as shown in FIG. 3, the entire resist 6 is removed from the surfaces of the substrate 1, the oxide film 3, the gate electrode 4, etc. by an oxygen plasmaashing method and boron (B+) 9 is then implanted by the ion implantation method under a condition of implantation energy 40 KeV and dosing amount $2 \times 10^{15}$/cm$^2$. In this process, a source-drain region of the p-channel transistor is formed and simultaneously the impurity is implanted into the gate electrode 4 of each of the p-channel and n-channel transistors. Implanted ions are activated for 30 minutes at a temperature 900° C. in an atmosphere of nitrogen. The implanted phosphorus 8 having the implantation energy 80 KeV and the implanted boron 10 having the implantation energy 40 KeV are mixed with each other in the active layer 2 of the n-channel transistor. With respect to such implantation energies, a mean ion range of phosphorus is smaller than that of boron and the phosphorus 8 and the boron 10 are respectively implanted into the upper and lower portions of the active layer 2 while the implanted amounts of phosphorus and boron are adjusted. Accordingly, the sheet resistivity of the source-drain section of the active layer 2 has a sufficiently low value about 500 $\Omega/\square$. When the implantation energies of phosphorus and boron are respectively set to 90 KeV and 30 KeV such that their mean ion ranges are approximately equal to each other, only a very high sheet resistivity about 5 k$\Omega/\square$ is obtained. At this time, when the sheet resistivity of the gate electrode 4 is about 200 $\Omega/\square$. Finally, silicon dioxide (SiO2) is deposited as an insulating film 11 by using the LP-CVD method and a contact hole is formed by using the photo-litho etching technique. Aluminum is deposited by using the spattering method and is patterned by using the photo-litho etching technique to form a metallic electrode, thereby completely manufacturing a C-MOS transistor device of the present invention as shown in FIG. 4.

EMBODIMENT 2

Figure 5:
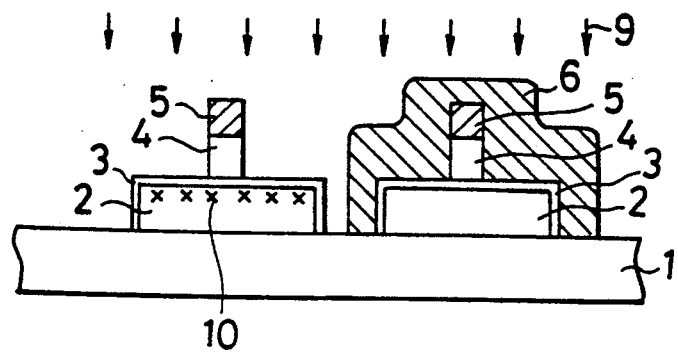
FIGS. 5 to 7 are cross-sectional views showing processes for manufacturing a C-MOS thin film transistor device in a modified embodiment of the present invention.
Figure 6:
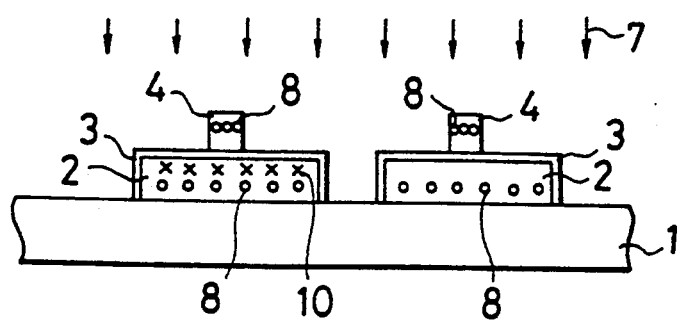
Figure 7:
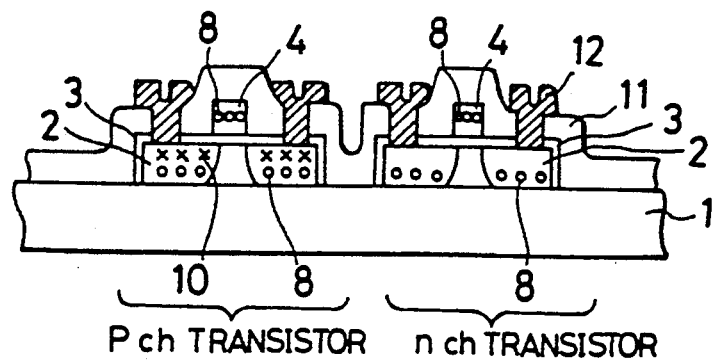

In the Embodiment 1, the boron 10 is implanted into the gate electrode 4. However, phosphorus can be also implanted into the gate electrode 4. In this case, the manufacturing processes until FIG. 1 are similarly used, but as shown in FIG. 5, boron (B+) is implanted under a condition of implantation energy 25 KeV and dosing amount $5 \times 10^{15}$ atoms/cm$^2$. Next, as shown in FIG. 6, phosphorus (P+) is implanted under a condition of implantation energy 100 KeV and dosing amount $2 \times 10^{15}$ atoms/cm$^2$. The subsequent processes are similar to those in the Embodiment 1. The features different from those in the Embodiment 1 are that the impurity of the above-mentioned gate electrode is composed of phosphorus and a transistor having a source-drain region having mixed impurities different from each other is constructed by a p-channel transistor instead of the n-channel transistor as shown in FIG. 7.

An obtained sheet resistivity of the gate electrode and an obtained sheet resistivity of the source-drain region of the p-channel transistor are approximately similar to those in the Embodiment 1.

In accordance with the construction of the C-MOS thin film transistor device and the manufacturing method thereof in the present invention, the resistance of the gate electrode can be reduced and the source-drain region can be formed by a single process although the resistance of the gate electrode is reduced and the source-drain region is formed by separate processes in the general construction of the C-MOS thin film transistor device and the manufacturing method thereof.

Further, in the present invention, the source-drain section of the n-channel transistor is divided into upper and lower layer portions to form high concentration regions of n- and p-type impurities so that the resistance of the source-drain region of the n-channel transistor can be reduced.

In the present invention, since the formed gate is of a single conductivity type, it is possible to sufficiently reduce gate resistance end operate the transistor device at a high frequency by using only an implantation process with respect to the source-drain region without using any special gate diffusion process.

This is because only the impurity of the first conductivity type is included in all the regions of the gate electrode.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method for manufacturing a C-MOS thin film transistor device, comprising the steps of:

forming a first semiconductor thin film layer of intrinsic polysilicon on an insulating substrate;

etching said formed first semiconductor thin film layer to thereby form a first source-drain section for an n-channel transistor and a second source-drain section for a p-channel transistor on said insulating substrate;

thermally oxidizing said first and second source-drain sections to thereby form a thermal oxide film on a surface of each of said first and second source-drain sections;

depositing intrinsic polysilicon on said thermal oxide film and an exposed insulating substrate to thereby form a second semiconductor thin film layer of the intrinsic polysilicon on said thermal oxide film and said exposed insulating substrate;

etching said formed second semiconductor thin film layer by a photolithography etching technique, thereby forming a first gate electrode on a part of said thermal oxide film corresponding to an upper surface of said first source-drain section and a second gate electrode on a part of said thermal oxide film corresponding to an upper surface of said second source-drain section, said first gate electrode and said second gate electrode each having on an upper surface thereof a photoresist layer used to pattern said first and second gate electrodes;

masking said second source-drain section, said second gate electrode and said photoresist layer on said second gate electrode with a resist layer;

implanting an n-type impurity into an upper layer portion of said first source-drain section composed of said intrinsic polysilicon while controlling implantation energy of said n-type impurity;

removing said photoresist layer on said first gate electrode, said resist layer formed on said second source-drain section and said second gate electrode, and said photoresist layer on said second gate electrode by an oxygen plasmaashing method;

implanting a p-type impurity respectively into a lower layer portion of said first source-drain section whose upper layer portion has been implanted with said n-type impurity, a lower layer portion of said second source-drain section composed of said intrinsic polysilicon, said first gate electrode composed of said intrinsic polysilicon and said second gate electrode composed of said intrinsic polysilicon, while controlling implantation energy of said p-type impurity; and heating an assembly of said n-channel transistor and said p-channel transistor at a predetermined temperature in an inactive atmosphere to thereby activate said implanted n-type and p-type impurities.

2. A method for manufacturing a C-MOS thin film transistor device according to claim 1, in which said first semiconductor thin film layer is formed by an LP-CVD method to have a thickness of 200 Å to 5000 Å.

3. A method for manufacturing a C-MOS thin film transistor device according to claim 1, in which said thermal oxide film is formed by thermal oxidation to have a thickness of 800 Å.

4. A method for manufacturing a C-MOS thin film transistor device according to claim 1, in which said second semiconductor thin film layer is formed by an LP-CVD method to have a thickness of 3000 Å.

5. A method for manufacturing a C-MOS thin film transistor device according to claim 1, in which said n-type impurity implanting step comprises the step of implanting phosphorus ions into said first source-drain section with an implanting energy of 80 KeV and a dosing amount of $4 \times 10^{15}$ atoms/cm$^2$.

6. A method for manufacturing a C-MOS thin film transistor device according to claim 1, in which said p-type impurity implanting step comprises the step of implanting boron ions into said first source-drain section, said second source-drain section, said first gate electrode and said second gate electrode using implantation energy of 40 KeV and a dosing amount of $2 \times 10^{15}$ atoms/cm$^2$.

7. A method for manufacturing a C-MOS thin film transistor device, comprising the steps of:

forming a first semiconductor thin film layer of intrinsic polysilicon on an insulating substrate;

etching said formed first semiconductor thin film layer to thereby form a first source-drain section for a p-channel transistor and a second source-drain section for an n-channel transistor on said insulating substrate;

thermally oxidizing said first and second source-drain sections to thereby form a thermal oxide film on a surface of each of said first and second source-drain sections;

depositing intrinsic polysilicon on said thermal oxide film and on an exposed insulating substrate to thereby form a second semiconductor thin film layer of the intrinsic polysilicon on said thermal oxide film and said exposed insulating substrate;

etching said formed second semiconductor thin film layer by a photolithography etching technique, thereby forming a first gate electrode on a part of said thermal oxide film corresponding to an upper surface of said first source-drain section and a second gate electrode on a part of said thermal oxide film corresponding to an upper surface of said second source-drain section, said first gate electrode and said second gate electrode each having on an upper surface thereof a photoresist layer used to pattern said first and second gate electrodes;

masking said second source-drain section, said second gate electrode and said photoresist layer on said second gate electrode with a resist layer;

implanting a p-type impurity into an upper layer portion of said first source-drain section composed of said intrinsic polysilicon while controlling implantation energy of said p-type impurity;

removing said photoresist layer on said first gate electrode, said resist layer formed on said second source-drain section and said second gate electrode, and said photoresist layer on said second gate electrode by an oxygen plasmaashing method;

implanting an n-type impurity respectively into a lower layer portion of said first source-drain section whose upper layer portion has been implanted with said p-type impurity, a lower layer portion of said second source-drain section composed of said intrinsic polysilicon, said first gate electrode composed of said intrinsic polysilicon and said second gate electrode composed of said intrinsic polysilicon, while controlling implantation energy of said n-type impurity; and heating an assembly of said n-channel transistor and said p-channel transistor at a predetermined temperature in an inactive atmosphere to thereby activate said implanted n-type and p-type impurities.

8. A method for manufacturing a C-MOS thin film transistor device according to claim 7, in which said first semiconductor thin film layer is formed by LP-CVD method to have a thickness of 200 Å to 5000 Å.

9. A method for manufacturing a C-MOS thin film transistor device according to claim 7, in which said thermal oxide film is formed by thermal oxidation to have a thickness of 800 Å.

10. A method for manufacturing a C-MOS thin film transistor device according to claim 7, in which said second semiconductor thin film layer is formed by a LP-CVD method to have a thickness of 3000 Å.

11. A method for manufacturing a C-MOS thin film transistor device according to claim 7, in which said p-type impurity implanting step comprises the step of implanting boron ions into said first source-drain section with an implantation energy of 25 KeV and a dosing amount of $5 \times 10^{15}$ atoms/cm$^2$.

12. A method for manufacturing a C-MOS thin film transistor device according to claim 7, in which said n-type impurity implanting step comprises the step of implanting phosphorus ions into said first source-drain section, said second source-drain section, said first gate electrode and said second gate electrode with an implantation energy of 100 KeV and a dosing amount of $2 \times 10^{15}$ atoms/cm$^2$.

* * * * *